United States Patent
Grove

(10) Patent No.: US 6,693,355 B1
(45) Date of Patent: Feb. 17, 2004

(54) METHOD OF MANUFACTURING A SEMICONDUCTOR DEVICE WITH AN AIR GAP FORMED USING A PHOTOSENSITIVE MATERIAL

(75) Inventor: Nicole R. Grove, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/445,561

(22) Filed: May 27, 2003

(51) Int. Cl.$^7$ .............................................. H01L 29/40
(52) U.S. Cl. ....................... 257/758; 257/750; 257/751; 257/415
(58) Field of Search ................................ 257/758, 750, 257/415, 751; 438/725

(56) References Cited

U.S. PATENT DOCUMENTS

| | | |
|---|---|---|
| 5,461,003 A | 10/1995 | Havemann et al. |
| 5,750,415 A | 5/1998 | Gnade et al. |
| 6,022,802 A | 2/2000 | Jang |
| 6,165,890 A | 12/2000 | Kohl et al. |
| 6,197,655 B1 | 3/2001 | Montanini et al. |
| 6,277,728 B1 | 8/2001 | Ahn et al. |
| 6,303,487 B1 * | 10/2001 | Kagamihara ................ 438/619 |
| 6,346,484 B1 | 2/2002 | Cotte et al. |
| 6,380,106 B1 | 4/2002 | Lim et al. |
| 6,413,852 B1 | 7/2002 | Grill et al. |
| 2001/0007788 A1 | 7/2001 | Chang et al. |
| 2001/0026951 A1 | 10/2001 | Vergani et al. |
| 2002/0009860 A1 | 1/2002 | Fjelstad |
| 2002/0081787 A1 | 6/2002 | Kohl et al. |
| 2002/0090794 A1 | 7/2002 | Chang et al. |
| 2002/0127844 A1 | 9/2002 | Grill et al. |
| 2002/0158337 A1 | 10/2002 | Babich et al. |
| 2002/0163082 A1 | 11/2002 | Lee et al. |
| 2003/0168747 A1 * | 9/2003 | Hussein et al. ............. 257/762 |

FOREIGN PATENT DOCUMENTS

| | | | | |
|---|---|---|---|---|
| JP | 8-86850 | * | 4/1996 | ......... H01L/21/316 |
| WO | WO 00/51177 | | 9/1999 | |

* cited by examiner

Primary Examiner—Jasmine Clark
(74) Attorney, Agent, or Firm—Robert L. King; James L. Clingan, Jr.

(57) ABSTRACT

A semiconductor structure (10) has one or more air gaps (44, 46) formed on a same layer with an interlevel dielectric (ILD) (30) using a common dielectric material (16) that is photosensitive. Additional ILDs (124, 162) may be formed on the layer. The photosensitive material is exposed in a manner such that a portion of the material is modified by light to change the cross-linking characteristics such that uncross-linked portions are outgassed upon heating. Air gaps form from the outgassing of the unlinked portions. ILD side-pillars (58, 60) to the air gaps which are formed by mask sizing or lithographic alignment provide additional structural support for the air gaps.

20 Claims, 7 Drawing Sheets

METHOD OF MANUFACTURING A SEMICONDUCTOR DEVICE WITH AN AIR GAP FORMED USING A PHOTOSENSITIVE MATERIAL

FIELD OF THE INVENTION

This invention relates generally to semiconductors, and more specifically, to semiconductor structures having an air gap.

BACKGROUND OF THE INVENTION

By significantly reducing the spacing between conductive metal lines in semiconductors, a decrease in capacitive coupling is needed. This decrease in capacitive coupling causes less cross-talk, lower capacitive losses and decreased RC (resistor/capacitor) time constants. In order to reduce capacitive coupling, much effort has been directed toward developing low dielectric constant (low-k) materials to replace conventional dielectric materials that are interposed between the metal lines. The lowest possible dielectric constant is 1.0 but most manufacturable materials typically have a dielectric constant of at least 2.5 or greater. Air has a dielectric constant of 1.0 and does not have the cost associated with many materials having a dielectric constant that is not as low as air. There have been attempts to fabricate semiconductor devices with air gaps between metal leads to reduce the capacitive coupling between electrically conducting members. Known semiconductor structures having air gaps are of varying complexity. Generally, an area within a semiconductor is identified for placement of an air gap. A layer is formed and a portion of the layer is etched in the identified area to form a cavity around which the air gap is created. The air regions are sealed, enclosed or isolated by a deposition technique.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
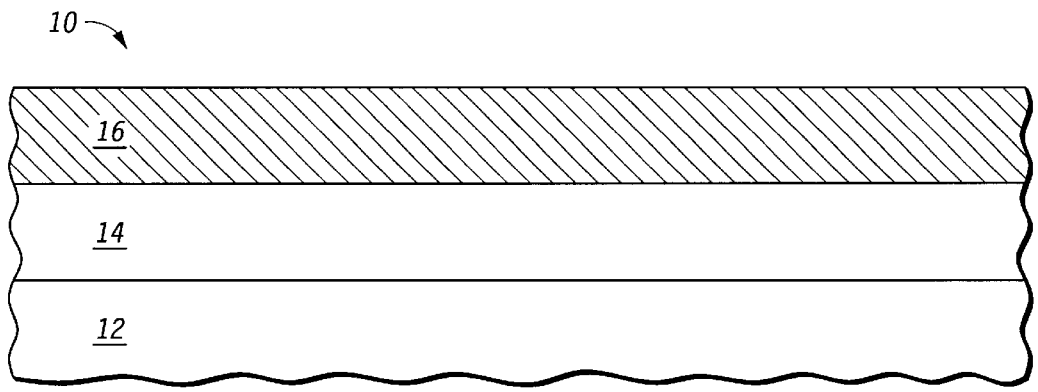
FIGS. 1–7 illustrate in cross-sectional form a device having air gaps integrated with an inter-level dielectric (ILD) material in accordance with one form of the present invention.

FIG. 1 illustrates a device 10 having a substrate 12 with an overlying layer 14 that is a layer that is applied as a planar layer or is made to be substantially planar. Overlying layer 14 may be formed by deposition or other techniques and may be composed of conductive materials, semiconductive materials, insulating materials or a combination of these materials. Overlying layer 14 is another layer that is a photosensitive sacrificial material 16. The photosensitive sacrificial material 16 may be formed on the overlying layer 14 by deposition techniques such as spin-on or chemical vapor deposition (CVD). In the illustrated form, the photosensitive sacrificial material 16 is a positive tone photo-definable material. In other words, when exposed to light the photosensitive nature of the sacrificial material 16 allows cross-links in the material to be broken. This will allow the un-cross-linked regions of the material to decompose and outgas upon heating. This property will be used herein to form air gaps for device 10 as described below. As used herein, the term air gap implies the use of atmospheric ambient for air. Negative tone of the photo-definable material is characterized by the application of un-cross-linked units which when exposed to light form cross-linked chains. When exposed to light, the photosensitive nature of the monomers will allow for cross-linked chains to be formed in the exposed areas. Photosensitive sacrificial material 16 is a dielectric and may be any of an inorganic, an organic material or an organic polymer combined with a photosensitive component. Additionally, photosensitive sacrificial material 16 has a dielectric constant that is less than four, mechanically stable at temperatures optimally up to at least 400 degrees Celsius but at least to 300 degrees Celsius and has low moisture absorption (e.g. less than one-half percent (0.5%) moisture absorption. These parameters are given by way of example only. More importantly, when cross-linked, the photosensitive sacrificial material 16 is structurally stable at temperatures up to at least a first temperature and the first temperature is at least high enough to permit completing formation of an integrated circuit containing device 10 at temperatures lower than the first temperature.

As an example, the photosensitive sacrificial material 16 is composed of a matrix for the formation of an Inter-Layer Dielectric (ILD) material and a photo component(s) which could be attached to the ILD material and/or as an un-bonded unit in the solution. The photo component or components result in either a positive or a negative tone material. In one form, the matrix could be a polynorbornene based polymer which has been shown to act as a sacrificial polymer under certain conditions. Other alternative matrix materials that may work are polyimides, benzocyclobutenes, or SiLK-like chemistries. As an example, the photo component could be based on chemically amplified resist technology where a side group composed of an acid-reactive polymer is attached to the polynorbornene. This side group could be an ester, an ether, a carbonate or formed of a composition such that a carbonium ion is formed wherein elimination of this ion results in an acid group which can be used to continue the reaction. This side group could also be used to improve other polymer characteristics, including adhesion and mechanical strength. The photo reaction would be initiated through the use of a photo-acid generator which when exposed to light would begin a reaction with the acid-reactive polymer attached to the ILD material. There are many substances which can act as photo-acids; two such classes include sulfonium and iodonium salts. In one embodiment, the acid-reactive polymer is used to create cross-links that form an ILD. The areas where an air gap is to be formed are exposed and the photo-acid reacts with the reactive polymer side group to break down the polymer and create smaller units. Upon a final bake, these smaller units are out-gassed and an air gap formed in these areas.

Figure 2:
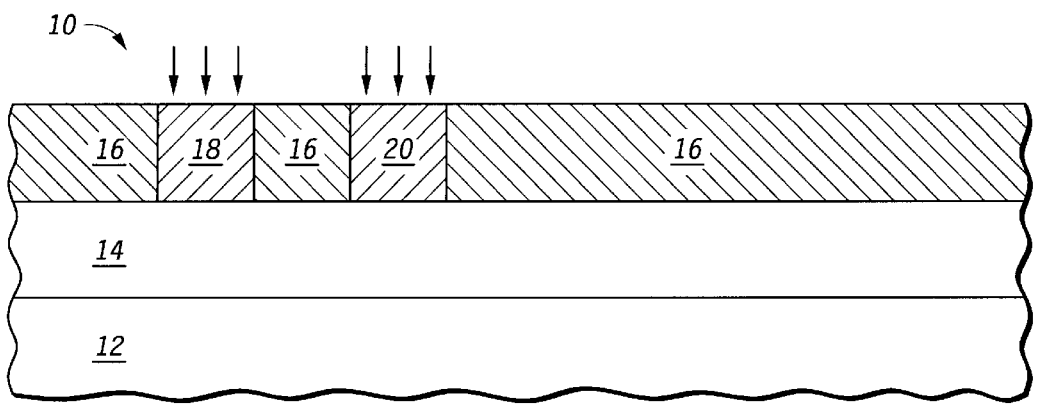

FIG. 2 illustrates exposed regions 18 and 20 of sacrificial material 16. Exposed regions 18 and 20 are dielectric structures and are selectively exposed to light as indicated by the arrows. Since sacrificial material 16 has a positive tone, the light breaks cross-links in sacrificial material 16. It should be noted that highly accurate lithographic alignment is not required initially to form the exposed regions 18 and 20. Exposed regions 18 and 20 will be the location of subsequent air gaps for device 10. It should be noted that the deposition of sacrificial material 16 may not result in a planar surface. Therefore, a conventional planarizing technique, such as a polishing step, may be required to provide a substantially planar top surface.

Figure 3:
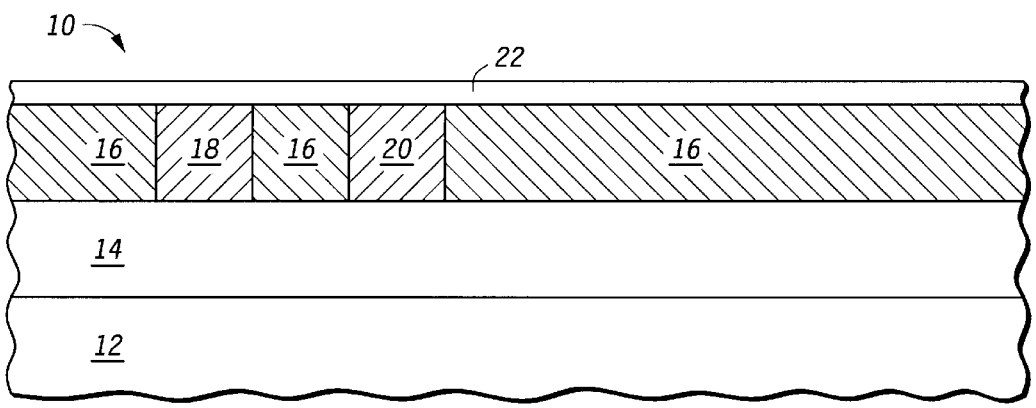

FIG. 3 illustrates a cap 22 that overlies the photosensitive sacrificial material 16 and the exposed regions 18 and 20. In one form, the cap may be formed of a low temperature TEOS or low temperature nitride. In an alternative form, the application of the cap 22 may be completed prior to the processing illustrated in FIG. 2. In such case, the cap 22 is a thin permeable film that must have sufficient antireflective coating (ARC) properties such that the photosensitive sacrificial material 16 can be exposed through the cap 22. In the illustrated form of FIG. 3, the ARC properties of the cap 22 are not relevant, but cap 22 must be permeable.

Figure 4:
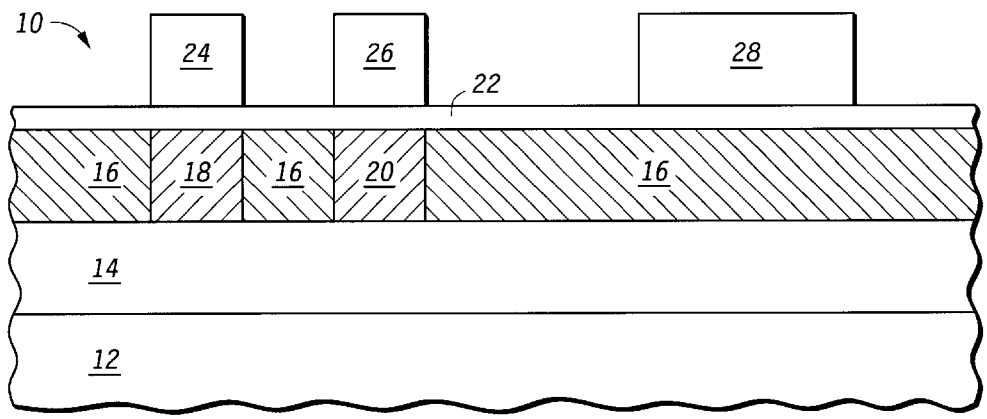

Illustrated in FIG. 4 is further processing of device 10 wherein patterned photoresist 24, 26 and 28 is provided respectively overlying exposed regions 18 and 20 and a predetermined region of the photosensitive sacrificial material 16 where an interlevel dielectric (ILD) is desired. The alignment of the photoresist 24 and 26 is desired to match the position of exposed regions 18 and 20, respectively. The photoresists 24, 26 and 28 permit etching of exposed areas of the cap 22 and the underlying photosensitive sacrificial material 16.

Figure 5:
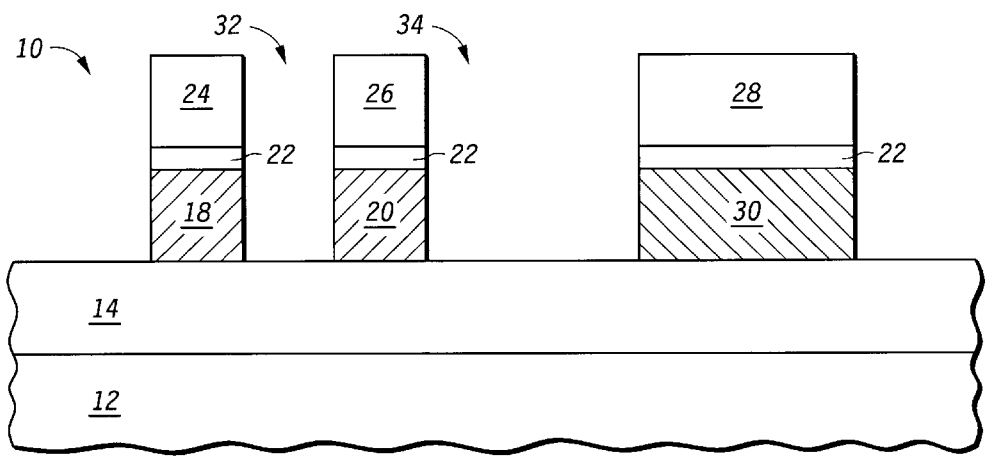

Illustrated in FIG. 5 is a cross-section of device 10 after the etching of exposed areas of the cap 22 and the underlying photosensitive sacrificial material 16 has been implemented. A region 30 is a photosensitive region of photosensitive material and is an unexposed portion of the photosensitive sacrificial material 16 that functions as a final ILD for device 10. The etching forms regions 32 and 34 for conductive materials for use as a trench structure, a via or a dual inlaid trench/via structure.

Figure 6:
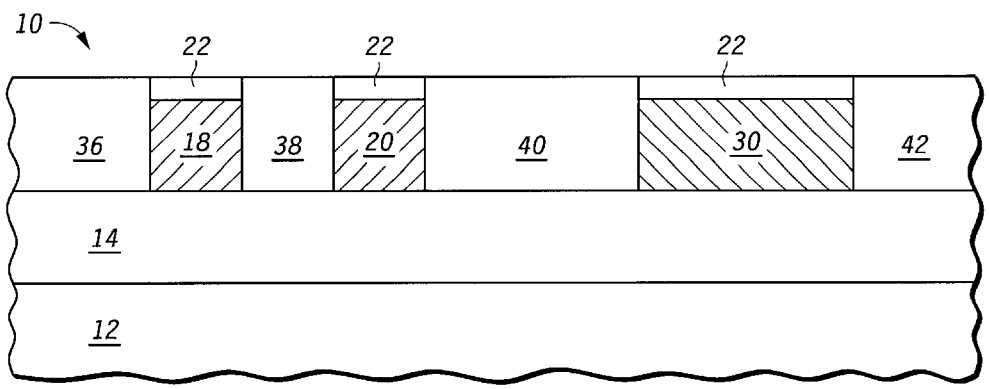

Illustrated in FIG. 6 is a cross-section of device 10 wherein conductive material 36, 38, 40 and 42 is deposited adjacent to and surrounding the exposed regions 18 and 20, region 30 and the overlying cap 22 therein. The conductive material 36, 38, 40 and 42 is formed, in one form, by conventional processing such as barrier/seed, plating, and chemical mechanical polishing (CMP). In one form, each of conductive material 36, 38, 40 and 42 represents a metal structure.

Figure 7:
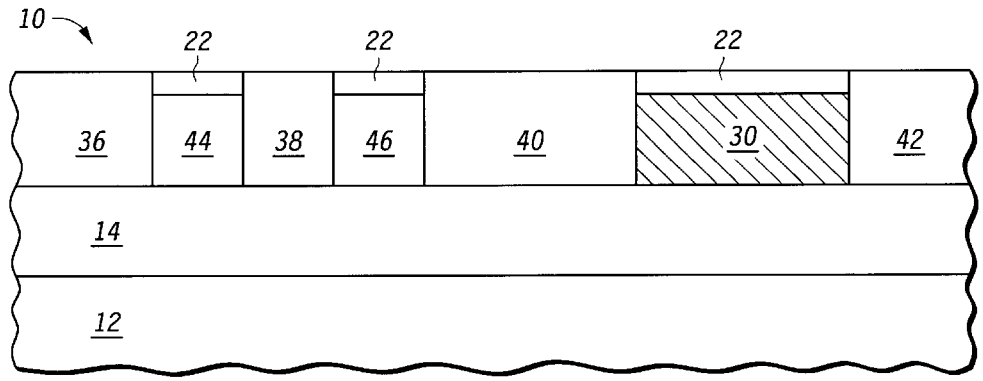
Figure 8:
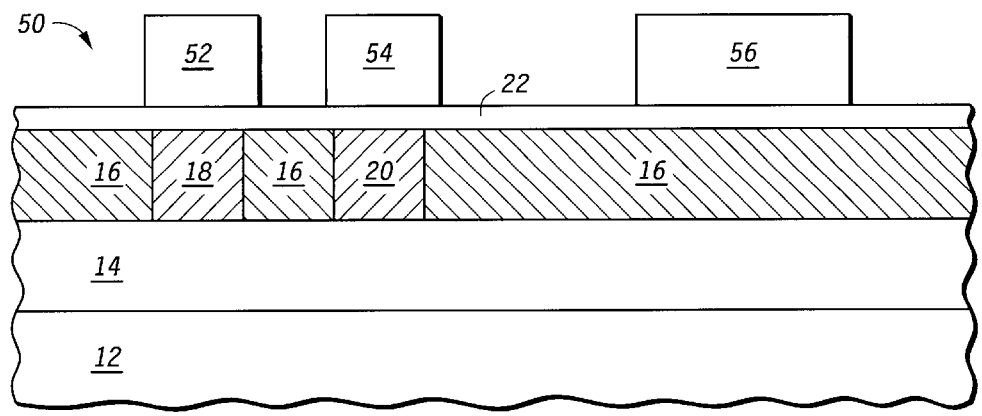
FIGS. 8–11 illustrate in cross-sectional form another device having air gaps integrated with an ILD material wherein mask alignment modifies the resulting structure.

Illustrated in FIG. 7 is a cross-section of device 10 as previously formed through FIG. 6 wherein device 10 is heated to a temperature substantially in the range of 300 to 475 degrees Celsius. The heat allows for outgassing of the small chains within photosensitive sacrificial material 16 which resulted from the exposure of the photosensitive sacrificial material 16 to light. The light creates a change in cross-linking character of any exposed photosensitive material. Upon outgassing of the photosensitive sacrificial material 16, air gaps 44 and 46 are realized. Depending upon the chemistry of the photosensitive sacrificial material 16, a lower temperature than 325 degrees Celsius may be sufficient to enable the formation of the air gaps. It should be noted that region 30 is an ILD formed from the photosensitive sacrificial material 16 and will remain in device 10. Region 30 does not outgas in response to the elevated temperature because the photosensitive sacrificial material 16 within region 30 was not exposed to light in this example having positive tone. If negative tone is used, the portions of sacrificial material that are exposed to light will remain.

Illustrated in FIGS. 8–11 is an alternative device 50 to the processing illustrated in FIGS. 4–7. For convenience of explanation, elements in common with FIGS. 4–7 are maintained through FIGS. 8–11. Patterned photoresist 52, 54 and 56 is provided wherein the alignment is not exact as was the illustration in FIG. 4. For example, the edges of photoresist 52 extend beyond the edges of exposed region 18. In the illustrated form, the right edge of photoresist 52 is further outside the right side of exposed region 18 than the left edge of photoresist 52 is outside the left side of exposed region 18. Similarly, the edges of photoresist 54 extend beyond the edges of exposed region 20. In the illustrated form, the right edge of photoresist 54 is further outside the right side of exposed region 20 than the left edge of photoresist 54 is outside the left side of exposed region 20. This difference in alignment is the result of expected and unintentional photo misalignment during processing. However, the width of the photoresist 52 and 54 may be intentionally widened as compared to photoresist 24 and 26 of FIG. 4 to allow for possible intentional formation of ILD pillars adjacent to subsequently formed air gaps. The reason for intentionally forming such ILD pillars is to add additional structural and mechanical integrity to the air gap structure. The unintentional misalignment may also form one ILD pillar depending upon which direction the misalignment occurs. However, this misalignment effect is not detrimental to the device 50 and may be accounted for during device design. It should be noted that the dimensions of the resulting air cavity will remain the same and are dependent on the width of exposed regions 18 and 20 of FIG. 2. Therefore the resulting effectiveness of the dielectric constant of the air cavity is not diminished.

Figure 9:
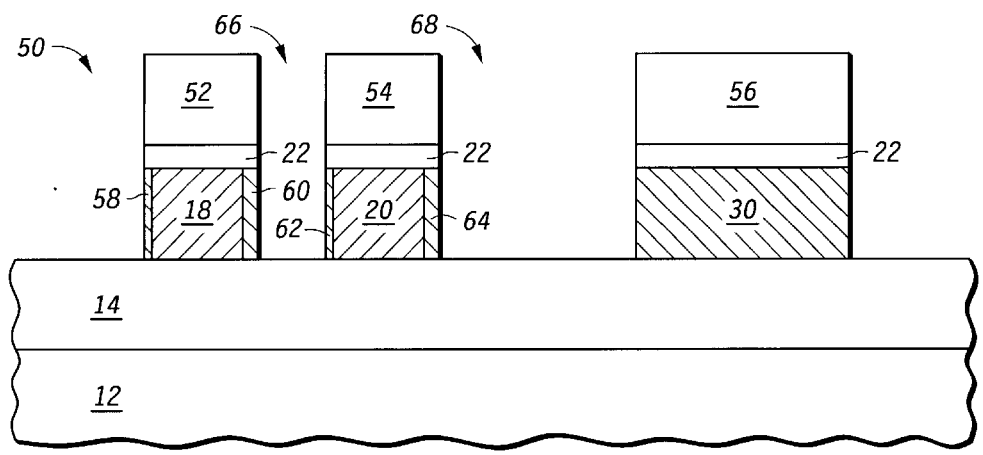

Illustrated in FIG. 9 is a resulting structure after a conventional etch has occurred with the extended patterned photoresist 52, 54 and 56. The etch process creates regions 66 and 68 for conductive materials for use as a trench structure, a via or a dual inlaid trench/via structure. Underlying the photoresist 52 and the cap 22 is the exposed region 18 that has the same width as exposed region 18 of FIG. 4. Adjacent exposed region 18 are sidewall layers or ILD side pillars 58 and 60. Because photoresist 52 was aligned in FIG. 8 further to the right of exposed region 18 than to the left, the ILD side pillar 60 has a greater width than ILD side pillar 58. Similarly, ILD side pillar 64 is wider than ILD side pillar 62 formed by intentionally or unintentionally misaligning the patterned photoresist 54 above exposed region 20.

Figure 10:
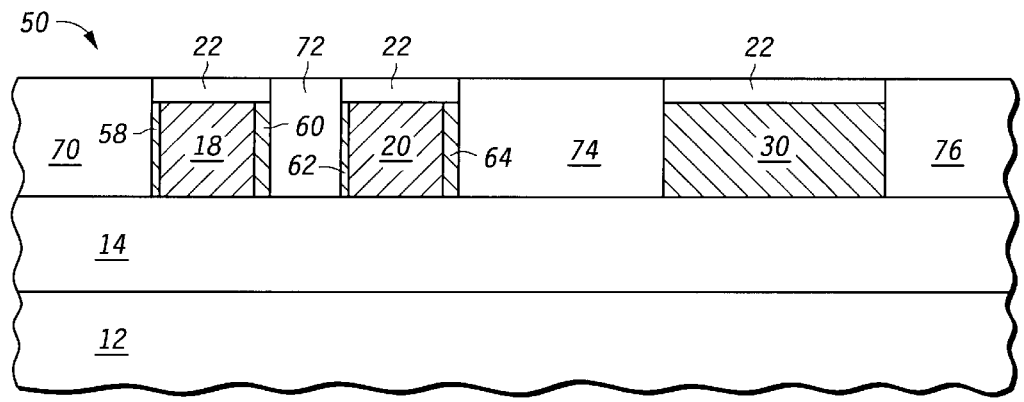

Illustrated in FIG. 10 is device 50 after removing photoresist 52, 54 and 56 and depositing a conductive material such as metal fill 70, metal fill 72, metal fill 74 and metal fill 76. The conductive material may be depositing by various conventional methods such as by plating. A subsequent conventional planarizing step such as a polish step is typically required to obtain the planar top surface illustrated in FIG. 10.

Figure 11:
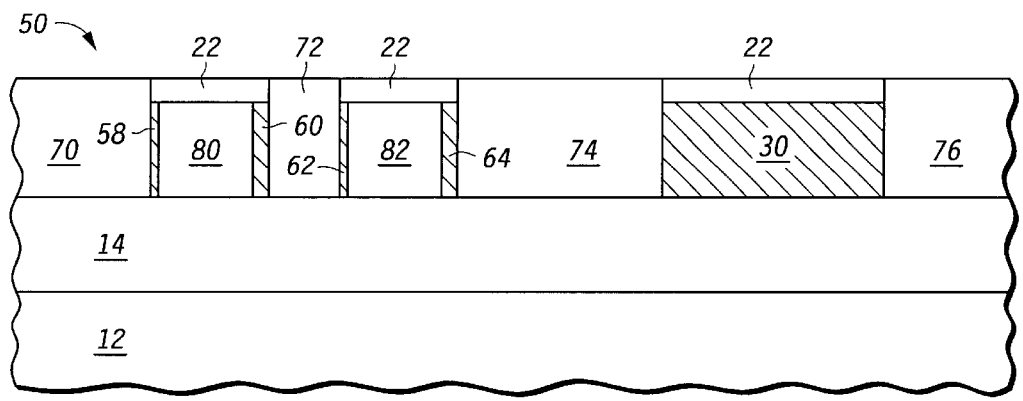

Illustrated in FIG. 11 is device 50 after heating of device 50 has occurred. The resulting structure of device 50 has an air gap 80 and an air gap 82. However, region 30 remains underlying cap 22 since region 30 was not exposed to light at the time that exposed regions 18 and 20 were. It should be appreciated that there has been provided a device wherein air gaps have been provided on a same level as an ILD by using the same material to form both the air gaps and the ILD. The use of the same material for both structures minimizes processing steps.

Figure 12:
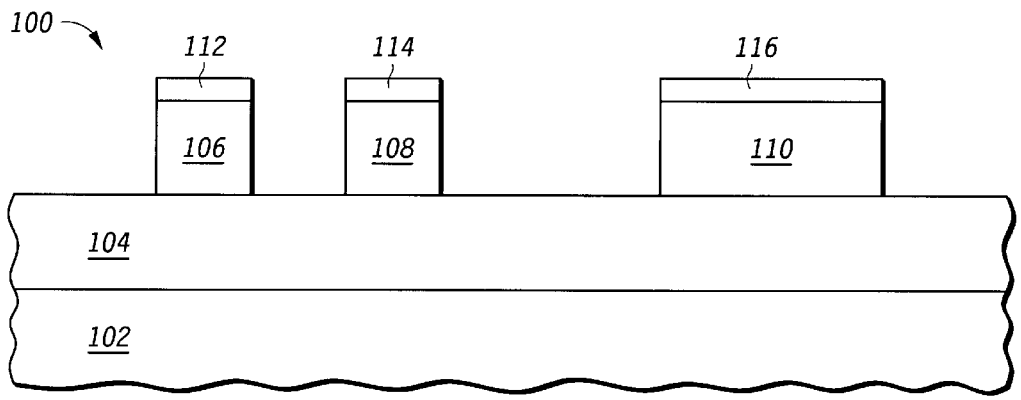
FIGS. 12–16 illustrate in cross-sectional form another device having air gaps integrated with an ILD material in accordance with another form of the present invention.

Illustrated in FIG. 12 is a device 100 having air gaps formed using another method where the metal structure is formed first using a conventional ILD such as TEOS, FTEOS or a low dielectric constant film and conventional metal structure formation. In FIG. 12 a substrate 102 has an overlying layer 104 which can be of any material (conductive, semiconductive or insulative). Metal structures or metal portions 106, 108 and 110 are provided overlying layer 104. At least two methods may be used to passivate metal portions 106, 108 and 110 with an overlying metal or dielectric barrier such as barriers 112, 114 and 116, respectively. The barriers may be selectively deposited materials such as cobalt tungsten phosphorous (CoWP) which would not require an additional photomask. An alternate method would be to deposit a blanket dielectric passivation layer such as nitride or silicon carbonitride (SiCN). Other materials may be used. This method requires the use of a photomask to protect the metal and barrier structures illustrated by metal portion 106/barrier 112, metal portion 108/barrier 114 and metal portion 110/barrier 116. A conventional unprotected ILD (not shown) is removed using a blanket etch to form device 100 of FIG. 12.

Figure 13:
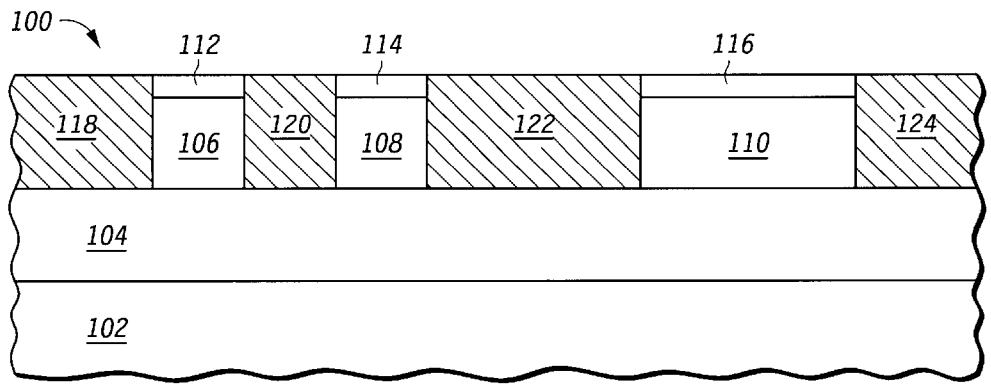

Illustrated in FIG. 13 is device 100 wherein a sacrificial photosensitive material is deposited to form positive tone photosensitive material 118, 120, 122 and 124. It should be appreciated that the photosensitive material 118, 120, 122 and 124 may require a polish step to accomplish the planar surface illustrated in FIG. 13. Materials as described in connection with FIGS. 1–7 may be used for photosensitive material 118, 120, 122 and 124.

Figure 14:
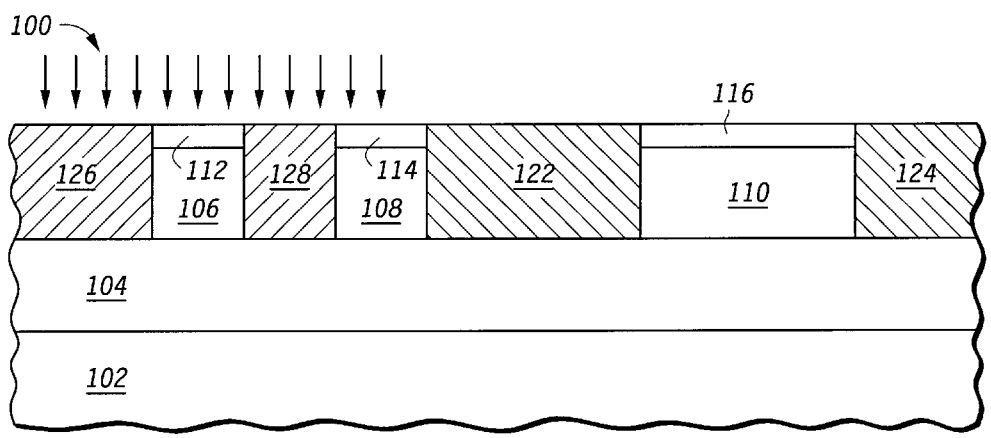

Illustrated in FIG. 14 is device 100 wherein a portion of the photosensisitve material 118 and 120 of FIG. 13 is radiated with light. The light may be a light source such as deep UV or other energy sources. By using a positive tone, the light causes the material cross-links to be broken which would ultimately create areas where air gaps are formed. These uncross-linked regions are designated in FIG. 14 as region 126 and region 128. It should be noted that since the photosensitive material 122 and 124 is not radiated withlight, the cross-links of the photosensitive material 122 and 124 are not broken. As noted previously, if a negative tone photosensitive material is used, the light exposed regions will become the interlevel dielectric (ILD) and the unexposed regions will become air gaps.

Figure 15:
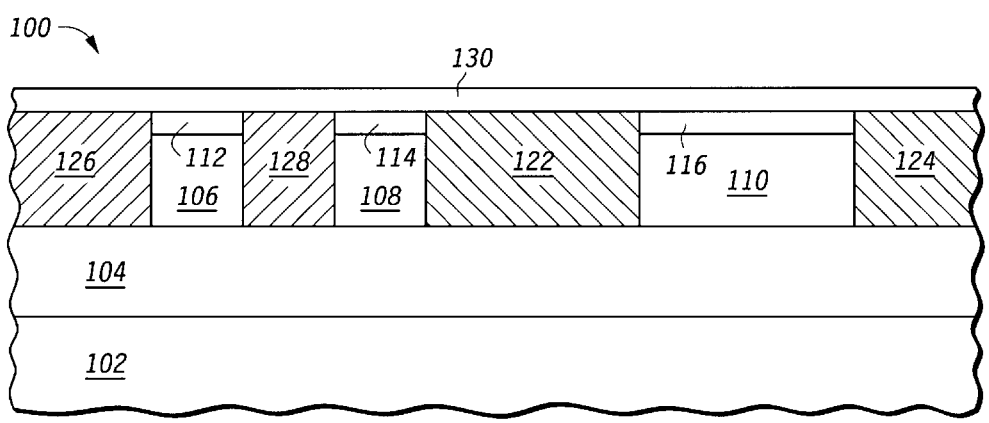

Illustrated in FIG. 15 is device 100 wherein a cap 130 is formed overlying device 100. As with cap 22, cap 130 is formed as a thin permeable film. In an alternative form, the application of the cap 130 may be completed prior to, the processing illustrated in FIG. 14. In such case, the cap 130 is a thin permeable film that must have sufficient antireflective coating (ARC) properties such that the photosensitive material 118, 120, 126 and 128 is exposed through the cap 130. In the illustrated form of FIG. 15, the ARC properties of the cap 130 are not relevant since light exposure occurred prior to the deposition of cap 130. However, cap 130 must be permeable.

Figure 16:
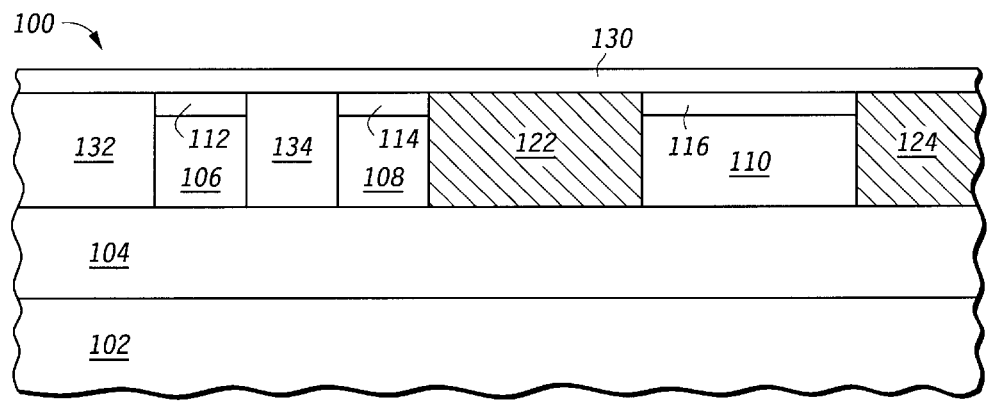

Illustrated in FIG. 16 is device 100 after device 100 is annealed or subjected to a bake step. The uncross-linked region 126 and region 128 from FIG. 15 are outgassed through the permeable cap 130 in response to the heat. This outgas step results in the formation of air gap 132 and 134 while regions 122 and 124 remain in place as an ILD. It should be noted that the formation of an air gap and an ILD on the same level of device 100 has occurred through the use of a same material, the photosensitive material 118, 120, 122 and 124.

Figure 17:
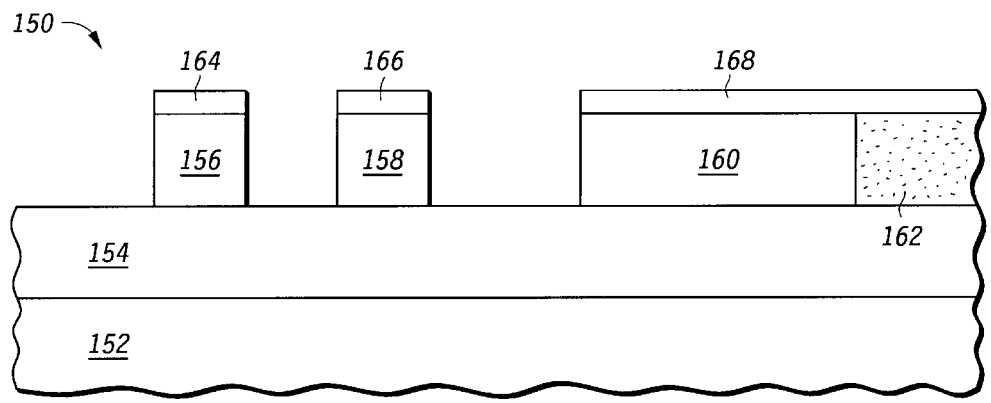
FIGS. 17–21 illustrate in cross-sectional form yet another device having air gaps integrated with multiple ILD materials in accordance with yet another form of the present invention.

Illustrated in FIG. 17 is a device 150 illustrating another form of a method to form an air gap and multiple ILDs of differing materials in a same level of the device. A semiconductor substrate 152 has an overlying layer 154 formed of any material (conductive, semiconductive or insulative). Metal structures in the form of metal portions 156, 158 and 160 are provided overlying layer 154. Metal portions 156, 158 and 160 may be referred to as a first metal structure, a second metal structure and a third metal structure, respectively. Additionally, a dielectric portion in the form of an ILD 162 is formed adjacent metal portion 160 and overlying layer 154. The ILD 162 may be of any dielectric material, such as TEOS, FTEOS or a low k dielectric. The ILD 162 has a different dielectric constant from the dielectric constant of the. photosensitive material used to form the air gaps.

In one form of FIG. 17, a blanket dielectric passivation layer such as nitride or silicon carbonitride (SiCN) is deposited overlying metal portions 156, 158 and 160 and an ILD 162. Other materials may be used. This method requires the use of a photomask to protect the metal and barrier structures and ILD 162 which will remain in a completed form of device 150. Any unprotected ILD portions (not shown) are removed from between metal portions 156, 158 and 160. A first cap 164 overlies metal portion 156. A second cap 166 that is physically separated from the first cap 164 overlies metal portion.158. A third cap 168 that is physically separated from the first cap 164 and the second cap 166 overlies metal portion 160 and the ILD 162. Each of the caps 164, 166 and 168 is permeable.

Figure 18:
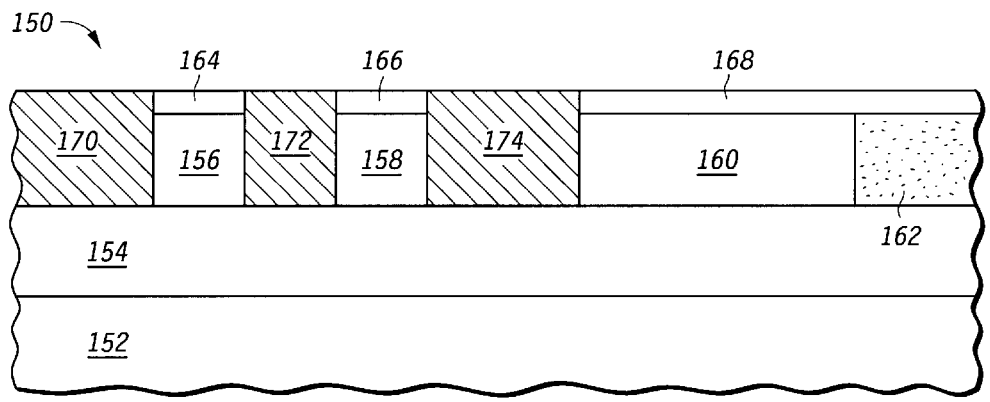

Illustrated in FIG. 18 is device 150 wherein a sacrificial photosensitive material is deposited to form positive tone photosensitive material 170, 172 and 174. It should be appreciated that the photosensitive material 170, 172 and 174 may require a polish step to accomplish the planar surface illustrated in FIG. 18. Materials as described in connection with FIGS. 1–7 may be used for photosensitive material 170, 172 and 174. The ILD 162 has a different dielectric constant from that of both photosensitive material 170, 172 and 174.

Figure 19:
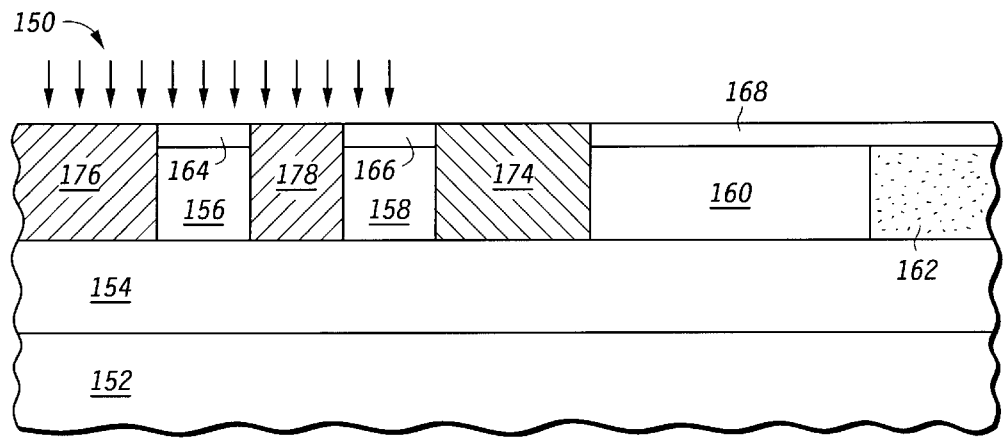

Illustrated in FIG. 19 is device 150 wherein a portion of the device 150 is radiated with light. The light may be a light source such as deep UV or other energy sources. By using a positive tone, the light causes the material cross-links to be broken which would ultimately create areas where air gaps are formed. These areas or regions are where photosensitive material 176 and photosensitive material 178 are located. The cross-linked region is designated as the region where photosensitive material 174 is located. It should be noted that since the photosensitive material 174 is not radiated with light, the cross-links of the photosensitive material 174 are not broken. The ILD 162 is not affected by the radiation since ILD 162 is not directly irradiated and is not photosensitive.

Figure 20:
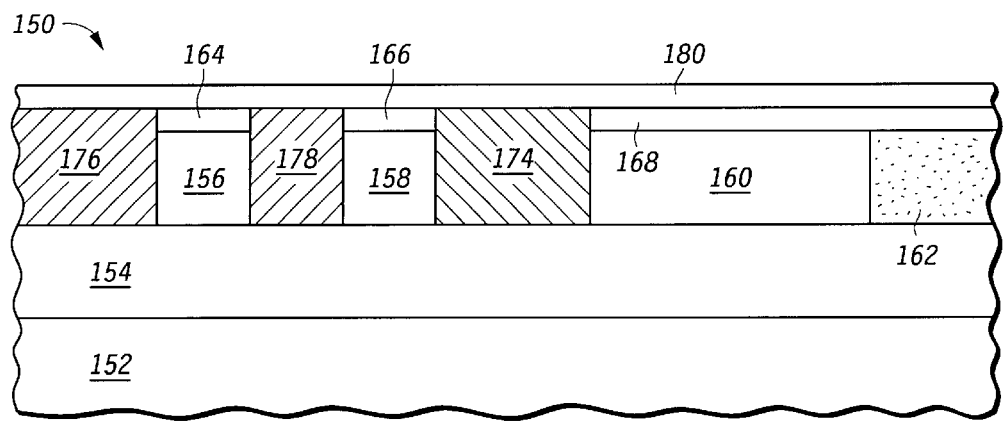

Illustrated in FIG. 20 is device 150 wherein a cap 180 is formed overlying device 150 as a continuous layer of permeable material. As with cap 22, cap 180 is formed as a thin permeable film following exposure to light of the photosensitive material. In an alternative form, the application of the cap 180 may be completed prior to the processing illustrated in FIG. 19. In such case, the cap 180 is a thin permeable film that must have sufficient antireflective coating (ARC) properties such that the photosensitive material 176 and 178 can be exposed through the cap 180. In the illustrated form of FIG. 20, the ARC properties of the cap 180 are not relevant, but cap 180 must be permeable.

Figure 21:
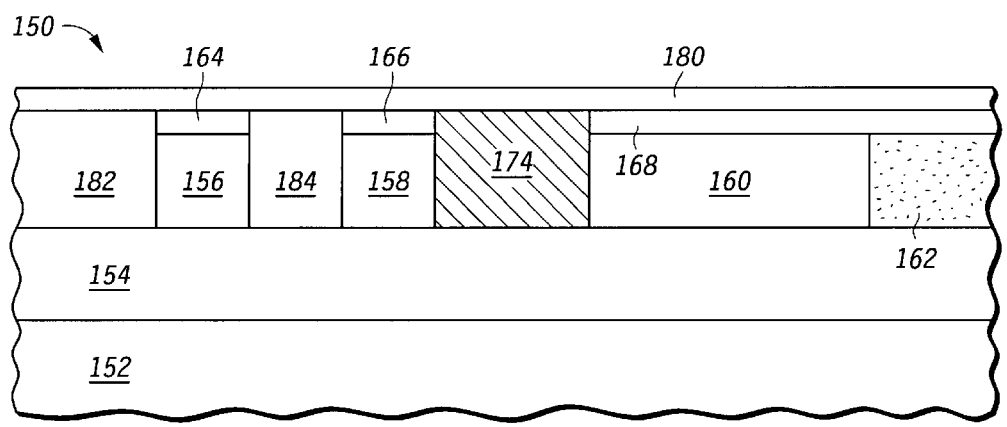

Illustrated in FIG. 21 is device 150 after device 150 is annealed or subjected to a bake step. The uncross-linked regions where photosensitive material 176 and photosensitive material 178 of FIG. 20 are located are outgassed through the permeable cap 180 in response to the heat. This outgas step results in the formation of air gaps 182 and 184 while the region where photosensitive material 174 is located remains in place as an ILD formed from the photosensitive material. The conventional ILD 162 remains from the initial formation thereof. It should be noted that the formation of an air gap and multiple ILDs of differing materials on the same level of device 150 has occurred through the use of a photosensitive material and a conventional ILD material.

By now it should be appreciated that there has been provided a semiconductor structure with one or more air gaps and one or more ILDs formed on a same layer and using a common photosensitive material. In one form provided herein, an air gap structure is provided using significantly fewer processing steps than would be required if the photosensitive material is deposited into metal structures with the ILD removed.

In the foregoing specification, the invention has been described with reference to specific embodiments. However, one of ordinary skill in the art appreciates that various modifications and changes can be made without departing from the scope of the present invention as set forth in the claims below. For example, various metals may be used for the conductive regions and the air gap structure may be used in any type of semiconductor device whether implemented in MOS, bipolar, GaAs or other technologies.

Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language).

What is claimed is:

1. A method of forming an air gap in an interlevel dielectric of a semiconductor device, comprising:
   providing a semiconductor substrate;
   forming a first layer over the semiconductor substrate having a first portion and a second portion, wherein the first layer comprises a photosensitive material;
   exposing the first portion of the first layer to light while blocking light from the second portion of the first layer to change a physical characteristic of the first portion;
   forming a second layer over the first layer, wherein the second layer is permeable; and
   heating the first layer to a temperature that causes one of the first portion and the second portion of the first layer to be removed by outgassing through the second layer to form the air gap while the other of the first and second portions of the first layer is retained over the semiconductor substrate.

2. The method of claim 1, wherein exposing the first portion of the first layer occurs prior to forming the second layer.

3. The method of claim 1, wherein exposing the first portion of the first layer occurs after forming the second layer.

4. The method of claim 1, wherein the second layer comprises low temperature TEOS.

5. The method of claim 4, wherein the first layer is an organic polymer.

6. The method of claim 5, wherein the first layer has a dielectric constant less than four, is mechanically stable at temperatures up to 300 degrees Celsius, and has moisture absorption of not greater than 0.5 per cent.

7. The method of claim 1, wherein exposing the first portion of the first layer causes the first portion of the first layer to be cross-linked.

8. The method of claim 1, wherein exposing the first portion of the first layer causes cross-links in the first portion of the first layer to be broken.

9. The method of claim 1, further comprising:
   forming a third layer, wherein the third layer is patterned photoresist having a first portion over the first portion of the first layer and a second portion over the second portion of the first layer;
   etching the first and second layers using the third layer as a mask to leave openings in the first and second layers; and
   filling the openings in the first and second layers with metal.

10. The method of claim 9, wherein the first portion of the third layer covers the first portion of the first layer and extends past the first portion of the first layer.

11. The method of claim 1, further comprising:
    forming a first metal structure prior to forming the first layer; and
    wherein forming the first layer is further characterized as forming the first and second portions of the first layer on opposing sides of the first metal structure.

12. The method of claim 11, wherein forming the first metal structure is further characterized as forming a second metal structure and a dielectric portion adjacent to the second metal structure, wherein the dielectric portion has a different dielectric constant from that of both the first and second portions of the first layer after exposing the first portion of the first layer.

13. A method for forming an integrated circuit, comprising:
    providing a semiconductor substrate;
    forming a first dielectric structure and a second dielectric structure over the semiconductor substrate, wherein the first and second dielectric structures comprises a photosensitive material that, when cross-linked, is structurally stable at temperatures up to at least a first temperature;
    exposing the first dielectric structure to light while preventing the second dielectric structure from receiving the light to cause the first dielectric structure to have a change in cross-linking character;

forming a first metal structure and a second metal structure, wherein the first metal structure is between the first and second dielectric structures and the second metal structure is adjacent to the first dielectric structure;

forming a second layer over the first and second dielectric structures, wherein the second layer is permeable;

heating the first and second dielectric structures to cause one of the first and second dielectric structures to outgas through the second layer to form an air gap; and completing formation of the integrated circuit.

14. The method of claim 13, wherein the second layer comprises a first cap over the first dielectric structure and a second cap over the second dielectric structure.

15. The method of claim 13, wherein exposing the first dielectric structure occurs prior to forming the second layer.

16. The method of claim 13, wherein exposing the first dielectric structure occurs after forming the second layer.

17. The method of claim 13, wherein forming the first metal structure occurs prior to forming the first dielectric structure.

18. The method of claim 13, wherein forming the first metal structure occurs after forming the first dielectric structure.

19. The method of claim 13, wherein forming the first metal structure further comprises forming a third metal structure, further comprising forming a third dielectric structure adjacent to the third metal structure, wherein the third dielectric structure has as dielectric constant different from that of the first and second dielectric structures after exposing the first dielectric structure.

20. The method of claim 13, further comprising forming a sidewall layer of the photosensitive material adjacent to the air gap.

* * * * *